United States Patent [19]

Fisch

[11] Patent Number: 4,587,198
[45] Date of Patent: May 6, 1986

[54] DYE TRANSFER IMAGE PROCESS

[75] Inventor: Richard S. Fisch, St. Paul, Minn.

[73] Assignee: Minnesota Mining and Manufacturing Company, St. Paul, Minn.

[21] Appl. No.: 631,533

[22] Filed: Jul. 16, 1984

[51] Int. Cl.[4] .......................... G03C 5/54; G03C 5/16; C23C 13/04; C23C 13/02
[52] U.S. Cl. .................................... 430/201; 430/203; 430/292; 430/293; 430/321; 430/275; 430/271; 430/325; 430/326; 430/323; 427/255.6; 427/255.7; 427/250; 346/135.1
[58] Field of Search ................... 430/203, 7, 292, 293, 430/321, 330, 201, 275, 271, 325, 326, 323; 427/255.6, 255.7, 250; 346/135.1

[56] References Cited

U.S. PATENT DOCUMENTS

| 3,751,285 | 8/1973 | Ruckert et al. | 117/34 |
| 3,811,844 | 5/1974 | Inoue et al. | 96/27 |
| 3,822,126 | 7/1974 | Inoue et al. | 96/27 |
| 4,063,878 | 12/1977 | Weeks | 427/255.6 X |
| 4,268,541 | 5/1981 | Ikeda et al. | 427/177 |
| 4,271,256 | 6/1981 | Kido et al. | 430/253 |
| 4,388,387 | 6/1983 | Tsuboi | 430/7 |

FOREIGN PATENT DOCUMENTS

| 0125086 | 11/1984 | European Pat. Off. | 430/275 |
| 2755730 | 6/1978 | Fed. Rep. of Germany | 430/203 |
| 0161199 | 12/1981 | Japan | 346/135.1 |

OTHER PUBLICATIONS

W. S. DeForest, *Photoresist: Materials and Processes,* McGraw-Hill Book Company, New York, N.Y., 1975, pp. 19-62.

R. A. Bartolini et al., "Review and Analysis of Optical Recording Media", *Optical Engineering,* vol. 15, No. 2, Mar./Apr. 1976, pp. 99-106.

*Primary Examiner*—John E. Kittle
*Assistant Examiner*—Cynthia Hamilton
*Attorney, Agent, or Firm*—D. M. Sell; J. A. Smith; M. A. Litman

[57] ABSTRACT

A process for providing a color image comprises exposing a radiation sensitive layer over a vapor deposited colorant layer and vaporizing the colorant to selectively transmit the colorant through the exposed layer. The change in solubility, penetrability and/or crosslinking or polymerization causes differential migration through the exposed layer.

11 Claims, No Drawings

DYE TRANSFER IMAGE PROCESS

BACKGROUND OF THE INVENTION

1. Field of the Invention

This invention relates to a dye transfer image process using photosensitive articles comprising vapor-deposited colorant layers on a substrate and a radiation sensitive resist layer over the colorant layer. The invention further relates to processes using such photosensitive articles having a metal layer which is preferably included in the photosensitive articles.

In particular, the present invention relates to a dye transfer image process with an imageable article having at least one vapor-deposited colorant layer on the surface of a substrate. The substrate may or may not already have a metal or other radiation absorbing layer present on the surface where the colorant is vapor-deposited. The radiation sensitive layer is first imagewise exposed to radiation that will alter the solubility and/or dye vapor permeability of the layer and the dye is transferred in imagewise fashion through the layer either with or without etching of the layer in the fashion of photoresists.

2. Description of the Prior Art

Colorants, such as dyes and pigments, are used in a wide variety of imaging procedures to provide optical density for viewable images. Such widely diverse technologies as color photography, diazonium salt coupling, lithographic and relief printing, dye-bleach imaging, leuco-dye oxidation, sublimation transfer of dyes and photoresistive imaging systems all may use dyes and pigments to form the viewable optical densities. Examples of some of these types of technologies may be found, for example, in U.S. Pat. Nos. 3,136,637, 3,671,236, 4,307,182, 4,262,087, 4,230,789, 4,212,936, 4,336,323 and the like. In all of these systems, the colorant is present in the imageable article within a carrier medium such as a solvent or polymeric binder. In the transfer of dyes by sublimation, it has generally been only the final image that consists of essentially pure dye on a receptor sheet. Each of these various imaging technologies has its various benefits and handicaps as measured by their respective complexity, consistency, image quality, speed, stability and expense.

Dyes have been vapor deposited for a number of different purposes. U.S. Pat. No. 4,268,541 deposits organic protective layers onto vapor-deposited metal layers. Amongst the organic materials deposited are Rhodamine B and phthalocyanine, a dye and a pigment. These materials are not described as actively involved in any imaging process.

U.S. Pat. No. 4,271,256 shows image transfer processes using vapor deposited organic materials, including dyes, where the transfer is made by stripping the image off a substrate with an adhesive film. The reference also discloses the use of dyes under a vapor-coated metal layer to enhance radiation absorption, but does not use a photoresist layer with the article.

U.S. Pat. No. 3,822,126 irradiates a dye layer (which may have been vapor-deposited) to oxidize or otherwise decolorize the dye and leave an image which can then be transferred to a receptor surface.

U.S. Pat. No. 3,811,884 discloses an image transfer process wherein a layer of organic coloring material is irradiated to color, discolor or fade the material so that the remaining dye image can be transferred by heating.

U.S. Pat. No. 3,751,285 discloses an image transfer process wherein a dye and a light-sensitive diazide sulfonic acid derivative are contemporaneously vapor-deposited to form a light sensitive system.

SUMMARY OF THE INVENTION

The transfer of a dye image can be effected from an article comprising in sequence a substrate, a vapor-deposited dye or pigment and a radiation sensitive layer. The radiation sensitive layer is imagewise exposed to radiation which causes a change in the solubility and/or permeability of the radiation sensitive layer. The vapor-deposited colorant (the dye or pigment) is transferred off the article by heating the article. A receptor can be used to receive the transferred dye or the article with dye selectively removed can be used as the final image. The colorant can be transferred without etching of the resist type layer because the permeability of the resist type layer has changed, preventing migration in polymerized areas. The photoresist also may be selectively etched away and the dye then transferred by heating. The use of a metal layer, on the substrate or between the dye and radiation sensitive layer (where etching is to take place) increases the efficiency of dye transfer by absorbing heat more efficiently or providing a more efficient barrier against dye transfer in non-etched areas.

The use of abrasion-protective layers on the vapor-deposited metal layer and/or the vapor-deposited color layer is a preferred construction of the present invention. The use of barrier layers between the vapor-deposited dye layer and the radiation sensitive or photosensitive layer is also desirable to prevent absorption of colorant into the photoresist layer.

It is desirable to prevent the penetration of the vapor-deposited dye or pigment layer into the photosensitive layer. The use of pigments or dyes insoluble and/or incompatible with the adjacent photosensitive layer or the use of a thin, vapor-deposited organic barrier layer between the dye/pigment and the photosensitive layer is highly desirable. The penetration of dyes and pigments into the photosensitive layer generates a disuniformity of speed in the vertical dimension of the photographic film which adversely affects the photoinitiated change in solubility essential to imaging. Such variations allow for undercutting or incomplete image cleanout in negative and positive modes, respectively.

The application of layers of organic material with a vapor pressure at 20° C. no greater than 1-n-octanol said material having (1) carbonyl groups (including those which are part of carboxyl groups), (2) phenoxy groups, (3) ester groups, (4) urea groups, (5) alcohol groups, (6) phthalocyanine or (7) saccharides onto vapor-deposited colorant or metal surfaces has been found to provide excellent damage resistance to the optional metal layer.

DETAILED DESCRIPTION OF THE INVENTION

The photosensitive article used in the practice of the present invention comprises a substrate, an optical density providing, vapor-deposited colorant layer and a radiation sensitive layer over the vapor-deposited colorant layer. The substrate may comprise a unitary layer or may comprise a composite such as a carrier layer having a vapor-deposited metal layer thereon or both a vapor-deposited metal layer and an abrasion-protective, vapor-deposited organic layer. The term "radiation sensitive layer" as used in the present invention means a layer which when struck by actinic radiation in the electromagnetic spectrum (preferably between and inclusive of infrared, visible and ultraviolet radiation) becomes:

(1) more soluble in an aqueous alkaline or organic solvent,
(2) less soluble in an aqueous alkaline or organic solvent,
(3) more penetrable by vapor phase organic materials (such as organic merocyanine dyes having a molecular weight between 150 and 400), or less penetrable by vapor phase organic materials (such as described above).

The dye or pigment must be coated in sufficient thickness so as to provide an optical density of at least 0.3 to a 10 nm band of the electromagnetic spectrum between 280 and 900 nm (preferably between 400 and 700 nm), preferably an optical density of at least 0.6, more preferably at least 0.8 and most preferably at least 1.0 is provided by the dye. Any dye or pigment from any chemical class which can be vapor-deposited can be used in the practice of the present invention. This includes, but is not limited to, methines, anthraquinones, oxazines, azines, thiazines, cyanines, merocyanines, phthalocyanines, indamines, triarylmethanes, benzylidenes, azos, monoazones, xanthenes, indigoids, oxonols, phenols, naphthols, pyrazolones, etc. The thickness of the layer depends upon the ability of the colorant to provide at least the minimum optical density. The vapor-deposited layer may be as thin as a few nanometers (e.g., three or ten nanometers) and may be as thick as a thousand nanometers. A general range would be three (3) to one thousand (1000) nanometers and a preferred range would be ten (10) to seven hundred (700) nanometers or ten (10) to two hundred (200) nanometers. A more preferred range would be twenty (20) to one hundred (100) nanometers thickness for the dye or pigment. A plurality of dye layers or a mixture of dyes may be used in a single layer. More importantly, the dye should provide a transmission optical density of at least 0.3. Ranges of density from 0.3 to 7.0 and higher are obtainable. Preferably optical densities of at least 0.5 or at least 1.0 should be provided. A range of 1.0 to 5.0 for the maximum optical density at the wavelength of maximum absorbance of the dye is preferred.

The radiation sensitive composition of the layer may be any negative-acting or positive-acting photosensitive resist material known in the art. Negative acting photosensitive resist systems ordinarily comprise a polymerizable composition which polymerizes in an imagewise fashion when irradiated, such as by exposure to light. These compositions are well reported in the literature and are commercially available. These compositions ordinarily comprise ethylenically or polyethylenically unsaturated polymerizable materials in combination with photosensitive free radical generators, although photosensitive epoxy systems with photoinitiated cationic polymerization catalysts are also known in the art. Preferably ethylenically unsaturated photopolymerizable systems are used, such as acrylate, methacrylate, acrylamide and alkyl systems. Acrylic and methacrylic polymerizable systems of oligomers, trimers, dimers or monomers in combination with free radical photoinitiators are most preferred according to the practice of the present invention. U.S. Pat. Nos. 3,639,185; 4,349,620; 4,008,084; 4,138,262; 4,139,391; 4,158,079; and 3,469,982, disclose photosensitive compositions generally useful in the practice of the present invention. Non-polymerizable binders, dyes, pigments, antioxidants, filler, surfactants, antistatic agents, lubricants and other well known adjuvants may be present within the photoresist layer. Useful binders, for example, include acrylic resins (e.g., poly(alkyl methacrylate), poly(ethylacrylate), copolymers and the like) polymeric polyols (e.g., polyvinyl alcohol, and hydroxy substituted addition polyesters such as polyacrylate and polymethylacrylate polyesters), hydroxy substituted copolymers (such as poly[methyl methacrylate/hydroxy methylacrylate]), natural colloids (for example, gelatin and shellac), polyvinyl hydrogenphthalate, ethylene oxide polymers and copolymers, polyacrylamides, polyethylenically unsaturated materials (such as polystyrene and its copolymers), polyamides, polyesters, and the other various polymeric materials both natural and synthetic, thermoplastic and crosslinked as known in the art. These materials preferably have at least some reasonable solubility in aqueous alkaline or organic developer solutions. The thickness of the photosensitive layer may generally be between 0.05 and 2.0 mils, preferably between 0.10 and 0.50 mils, most preferably at least 0.1 and less than 0.3 mils.

The photoresist type radiation sensitive layers may be replaced by less familiar radiation sensitive layers which can act as resist. The graded metal layer of U.S. Pat. No. 4,430,366, a non-graded metal/metal oxide as disclosed in U.S. Pat. No. 4,364,995, bismuth and tellurium sputtered or vapor-deposited layers with or without oxides thereof, and other heat or electron ablatable, phase-changing or redissolvable inorganic layers are useful as photosensitive layers. These materials need not even be treated with a solvent since the inorganic layer vaporizes, dissolves or retracts in response to radiation. Organic layers as previously described are, however, the preferred radiation sensitive layers.

Another article useful in the process of the present invention further comprises a substrate, a vapor-deposited metal layer on at least one surface of said substrate, a vapor-deposited colorant layer on the metal layer, and optionally a protective vapor-deposited organic layer on said metal layer comprising a material having phenoxy groups, alcohol groups, urea groups, ester groups, saccharide, or carbonyl groups (which may be part of carboxyl groups). It is preferred that there be no substantial amount of radiation absorbing material between the photoresist layer and the vapor-deposited colorant layer. The structure with the dye or pigment layer on a substrate, with a vapor deposited metal layer between the vapor-deposited colorant layer and a photoresist layer is, however, a useful structure. In such a structure, the dye would be heat transferred (e.g., sublimed) after etching of the metal layer.

The substrate may be any surface or material onto which the colorant may be vapor-deposited. The substrate may be rough or smooth, transparent or opaque, and continuous or porous. It may be of natural or synthetic polymeric resin (thermoplastic or thermoset), ceramic, glass, metal, paper, fabric, and the like. For most commercial purposes the substrate is preferably a polymeric resin such as polyester (e.g., polyethyleneterephthalate), cellulose ester, polycarbonate, polyvinyl resin (e.g., polyvinylchloride, polyvinylidene chloride, polyvinylbutyral, polyvinylformal), polyamide, polyimide, polyacrylate (e.g., copolymers and homopolymers of acrylic acid, methacrylic acid, methyl methacrylate, n-butyl acrylate, acrylic anhydride and the like), polyolefin, and the like. The polymer may be transparent, translucent or opaque. It may contain fillers such as carbon black, titania, zinc oxide, dyes, pigments, and of course, those materials generally used in the formation of films such as coating aids, lubricants, antioxidants, ultraviolet radiation absorbers, surfactants, catalysts and the like.

The vapor-deposited metal layer may be any vapor-deposited metal or metalloid layer. According to the practice of the present invention, the term metal layer is defined as a layer comprising metal, metal alloys, metal salts, and metal compounds. The corresponding meaning applies to the term metalloid layer. The term metal in metal layer is defined in the present invention to include semi-metals (i.e., metalloids) and semiconductor materials. Metals include materials such as aluminum, antimony, beryllium, bismuth, cadmium, chromium, cobalt, copper, gallium, germanium, gold, indium, iron, lead, magnesium, manganese, molybdenum, nickel, palladium, rhodium, selenium, silicon, silver, strontium, tellurium, tin, titanium, tungsten, vanadium, and zinc. Preferably the metal is selected from aluminum, chromium, nickel, tin, titanium and zinc. More preferably the metal is aluminum. Metal alloys such as aluminum-iron, aluminum-silver, bismuth-tin, and iron-cobalt alloys are included in the term metal layer and are particularly useful. Metal salts such as metal halides, metal carbonates, metal nitrates and the like are useful. Metal compounds such as metal oxides and metal sulfides are of particular utility in imaging systems. Metal layers comprising mixtures of these materials such as mixtures of metal-metal oxides, metal-metal salts, and metal salts-metal oxides are also of particular interest. U.S. Pat. No. 4,364,995 teaches a method by which such coatings could be provided.

A particularly desirable substrate comprises a microstructured radiation-absorbing surface. These structures are generally known in the art as for example in U.S. Pat. Nos. 3,975,197, 4,138,262, and 4,252,843. In these patents the surface structure of the substrate is modified so as to absorb incident radiation. U.S. Pat. No. 4,396,643 discloses a microstructured surface having protuberances with average heights from peak to base of 20 to 1200 nanometers which provides very good radiation absorption. In the practice of the present invention it is not essential to coat the microstructured substrate with metal since they can be coated instead with dye. It is still useful to optionally coat the surface with a conforming thin film of metal to increase radiation absorption.

The thickness of the vapor-deposited metal layer depends upon the particular needs of the final product. The thickness should be at least about 2 nm. Generally, the layer would be no thicker than 750 nm which would require a long etching period, if etching of the metal layer was required. A more practical commercial range would be between 10 and 500 nm. A preferred range would be between 20 and 400 nm and a more preferred range would be between 25 and 300 nm or 30 and 200 nm. These values being of greatest concern only where the metal layer is to be etched.

It is preferred that the majority of the cross-section of the metal layer consist essentially of metal, metal alloys, metal salts and metal compounds. Traces of up to 10% or more of other materials may be tolerated generally in the layer, and in fact in certain processes of manufacture the boundary region of the metal layer and the protective layer may have a graded or gradual change from 100% metal to 100% organic material. But metal layers with the majority (at least 50%) of its cross-section consisting essentially of metals, metal alloys, metal salts, metal compounds and combinations thereof are preferred. The metal layer should have fewer than 100, preferably fewer than 50, and more preferably fewer than 30 defects per 177 mm$^2$.

Vapor-deposition of the colorant or metal layers may be accomplished by any means. Thermal evaporation of the metal or colorant, ion plating, radio frequency sputtering, A.C. sputtering, D.C. sputtering and other known processes for deposition may be used in the practice of the present invention. The pressure may vary greatly during coating, but is usually in the range of $10^{-6}$ to $10^{-4}$ torr.

Organic protective layers may comprise a material with a vapor pressure at 20° C. no greater than that of 1-n-octanol selected from the group consisting of (1) organic materials having carbonyl groups (which may be but are not required to be part of carboxyl groups), (2) phenoxy groups, (3) alcohols or (4) saccharides. The term "organic material" is used because the protective coating does not have to be a single compound or a monomeric compound. In addition to those types of materials, dimers, trimers, oligomers, polymers, copolymers, terpolymers and the like may be used.

The organic materials containing carbonyl groups which are not part of a carboxyl group, for example, include (1) amides, such as phthalamide, salicylamide, urea formaldehyde resins, and methylene-bis-acrylamide, and (2) anilides, such as phthalanilide and salicylanilide. It has been found that these organic materials may be used in layers as thin as 1 nm and provide good abrasion or mar protection. They may be used in thicknesses of up to 600 nm, but without dramatic improvement of results, and in fact often with some diminution of properties. A preferred range would be between 3 and 200 nm, more preferably between 5 and 100 nm, and most preferably at least 5 and lower than 30 or 20 nm.

The organic material containing ester groups includes such materials as polyester oligomers, low molecular weight polyester polymers (e.g., polyethyleneterephthalate, polyethyleneisophthalate, etc. having molecular weights between 5,000 and 50,000), diallyl phthalate (and its polymers), diallyl isophthalate (and its polymers), monomethyl phthalate, carboxylic acid alkyl esters, and the like.

The organic material containing phenoxy groups include such materials as Bisphenol A, and low molecular weight phenol formaldehyde resins (e.g., Resinox ®). The alcohol containing materials would include 1-n-octanol, dodecanol, benzyl alcohol and the like.

The photoresist layer may be either a negative-acting or positive acting photoresist as known in the art. Positive-acting photoresist systems ordinarily comprise polymeric binders containing positive-acting diazonium salts or resins such as those disclosed, for example, in U.S. Pat. Nos. 3,046,120, 3,469,902 and 3,210,239. The positive-acting photosensitizers are commercially available and are well reported in the literature. Negative-acting photosensitive resist systems ordinarily comprise a polymerizable composition which polymerizes in an imagewise fashion when irradiated, such as by exposure to light. These compositions are well reported in the literature and are widely commercially available. These compositions ordinarily comprise ethylenically or polyethylenically unsaturated photopolymerizable materials, although photosensitive epoxy systems are also known in the art. Preferably ethylenically unsaturated photopolymerizable systems are used, such as acrylate, methacrylate, acrylamide and allyl systems. Acrylic and methacrylic polymerizable systems are most preferred according to the practice of the present invention. U.S. Pat. Nos. 3,639,185, 4,247,616, 4,008,084, 4,138,262, 4,139,391, 4,158,079, 3,469,982, U.K. Pat. No. 1,468,746, disclose photosensitive compositions generally useful in the practice of the present invention. U.S. Pat. No. 4,314,022 discloses etchant solutions particularly useful in the practice of the present invention.

The processes of the present invention may be performed on the variously described imageable articles in the following manner.

Where the photoresist is negative acting and is coated directly over a vapor-deposited dye (or with an intermediate dye-permeable barrier layer) on any substrate, the process may be performed in either of two routes. After irradiating sufficiently to imagewise polymerize the photoresist, the article may be heated to transfer the image to a receptor sheet. Since the exposure has rendered certain areas of the photoresist less permeable to the dye, the dye will be transferred to the receptor much more rapidly in the unexposed areas. After irradiation, the unexposed portions of the photoresist could be removed by a developer, leaving the vapor-deposited colorant layer intact. Any intermediate dye-permeable barrier layer may be etched or not. With the photoresist removed in an image-wise distribution, heating would then allow a rapid removal of the colorant where no polymerized photoresist layer is present.

Where the photoresist layer is positive-acting, it is generally desirable to etch away irradiated portions of the photoresist layer. Although the rate of permeability is often modified, the rate is not so greatly differentiated between exposed and unexposed areas as to provide excellent images. Only moderate quality images can be obtained without etching in such systems.

The heating is done approximately uniformly during the dye-transfer operation. By "uniformly" it is meant only that there is not such a difference in the variation of heat applied at one area versus another that it is the amount of heat which determines whether or not dye is transfered. This distinguishes from procedures used in laser heated dye sublimation processes.

The processes described above will work whatever the nature of the substrate. The metal layers, the metal-coated microstructure layers and the other variables described above vary only the efficiency of the process.

Where the imageable article has an etchable layer between the photoresist and the vapor-deposited colorant layer (as with the construction of U.S. Pat. No. 4,271,256), the metal layer must be etched prior to heating to transfer the dye.

Essentially any substrate may be used as a receptor surface. Paper, polymeric film, ceramics, glass, fibrous sheet, metal and the like may be readily used as a receptor. Those materials, having utility in the art as receptors for sublimed or vapor transferred dyes and pigments would be particularly suitable in the practice of the present invention.

The following examples further illustrate practice of the present invention.

EXAMPLE 1

A flexible 4 mil polyester base vapor coated with 700 nm of aluminum was in turn vapor coated with a layer of Crompton & Knowles XB-2 azo heat transfer black dye at a vacuum pressure of $10^{-4}$ Torr. This black colored layer was in turn vapor coated with a layer of 100 Å of Goodyear Vitel PE200 polyester resin and then solvent coated with a positive acting photoresist of the type used in Example 3 of U.S. Pat. No. 4,247,616. This construction was exposed to a halftone step tablet in a Berkey Ascor 2KW printer (metal halide lamp to film distance 1 meter) for a period of 20 seconds and developed using the processing chemistry disclosed in Example 1 of U.S. Pat. No. 4,314,022. This film was placed in contact (image to transfer layer) to a potential transfer support consisting of a polyester/cotton fabric. Heat and pressure were applied for 20 sec. at 163° C. and 40 lbs. using a press of the type used in heat transfer printing. A black halftone image was transferred to the fabric. Using the same vapor coated master three more transfers were made to other samples of polyester cotton sheets. Using the same master, two additional halftone transfers were made to the reflection paper sheeting used in the 3M "Color in Color" process. That receptor sheet comprised plain paper coated on one surface with a copolymer resin of vinyl acetate and vinyl chloride (Union Carbide VYNS).

EXAMPLE 2

A flexible 4 mil polyester base coated with 700 nm aluminum and in turn vapor coated with a layer of perylene green pigment using the conditions of Example 1, was further vapor coated with 100 Å of Vitel PE 200, and then coated with the photosensitive layer of Example 1. This film was exposed and developed as in Example 1. A transfer printing of the perylene pigment onto a "Color-in-Color" sheet was performed under the same conditions of Example 1, forming a colored halftone replica of the original.

EXAMPLE 3

Example 2 was repeated except that a colored layer of vapor coated Phthalocyanine Blue Pigment was substituted for the perylene pigment. A cyan blue color was transferred to the receptor sheeting.

EXAMPLE 4

A 4 mil polyester base vapor coated with a phthalocyanine pigment layer and a solvent coated photosensitive resist layer of Example 1 was exposed in the Berkey Ascor 2 KW source (20 sec.) and developed using the processing solution of Example 1 with a printing plate developer pad. The pigment was transferred as in Example 7. A cyan colored image on a clear background was visible.

EXAMPLE 5

A yellow dye having the structural formula

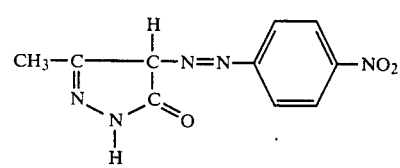

was placed into a molybdenum metal boat in a vacuum chamber 20 cm from a web of a clear polyester film. At a pressure of $10^{-4}$ torr heat was applied to the dye by a resistive heating element at 84° C. Heating was stopped when a transmission optical density of 2.0 (blue filter Status A MacBeth Densitometer) was reached. An additional protective layer of 100 nm of Vitel PE 200 ™ (Goodyear) was vapor coated onto the yellow dye layer.

The yellow colored web was removed from the chamber and the dye-colored surface of the film was overcoated with a continuous negative-acting photoresist composition comprising:

12 g 1,3-bis(3-[2,2,2-(triacryloyloxymethyl)ethoxy-2-hydroxypropyl]-5,5-dimethyl-2,4-imidazolidinedione
1.6 g polyallylisophthalate prepolymer (Dapon ®35)
3.2 g poly(vinyl acetate/vinyl chloride)copolymer (86/14)
0.4 g poly(butyl methacrylic acid/methyl acrylic acid)-copolymer (80/20)
0.7 g Michler's Ketone
1.4 g diphenyliodonium tetrafluoroborate to 300 g acetone The coating solution was applied to the colored web, air dried for twenty-four hours, and provided a radiation sensitive layer approximately 20 micrometers thick. The sample was cut into two portions. Both portions were exposed to ultraviolet radiation (mercury halide vapor lamp) through a 0–4 continuous density half-tone wedge for a sufficient time to fully cure the resist as Step 4. One sample was placed in contact with receptor paper and heated for one minute at 150° C. under pressure. A yellow positive image was transferred onto the paper.

The second sample was etched with an aqueous alkaline developer to remove the unpolymerized resist. This sample was heated for fifteen seconds at 150° C. under pressure to transfer a yellow positive image to receptor paper.

EXAMPLE 6

A black dye (XB-6 from Crompton and Knowles) was coated (to an optical density on 1.5), overcoated with a polyacryloyl negative photoresist, dried, and imaged identically as done in Example 5. Black images were transferred to the receptor sheet in both instances.

EXAMPLE 7

Example 6 was repeated except that vapor-deposited aluminum on three mil polyester film was used as the substrate. Useful images were transferred in all cases.

EXAMPLES 8–11

The pigments and dyes of Examples 1, 2, and 3 and 5 were vapor deposited on metal-coated microstructured, radiation absorbing substrates of Example 1 of U.S. Pat. application Ser. No. 279,978, filed June 29, 1981. Each of the colorant coated substrates were overcoated with the liquid photoresist composition of Example 3 of U.S. Pat. No. 4,247,616, dried, imaged, and developed according to Example 1. Negative images were produced from each sample.

EXAMPLE 12

A 4 mil (0.102 mm) polyester film base was vapor coated with a phthalocyanine pigment to a transmission optical density of 2.0, then vapor coated with 200 angstroms of PE 200 Vitel polyester resin, then vapor coated with 500 angstroms of aluminum.

This construction was placed into an apparatus like that described in "Digital Microtape Recorder" by Agarwal and "Optical and Electrooptical Information Processing" by Tippett Berkovitz Clap et al. (MIT Press, 1965). The metal layer was in proximity to fine wires (0.01 inches diameter, 0.254 mm) separated by gaps of 0.02 inches (0.508 mm). A microsecond pulse (approximately 120 pulses/second) at 10 kV was applied to the wires.

The pulse removed the aluminum protective layer adjacent the wires. The pulse etched aluminum was then placed in contact with a receptor sheet like that of Example 1 and heated at 325° F. (163° C.) under 40 lbs. (18.2 Kg) pressure for 20 seconds. Blue phthalocyanine dots were transferred to the receptor sheet where the aluminum layer had been removed.

EXAMPLE 13

A construction of a 4 mil (0.102 mm) polyester base, 200 angstroms of a vapor coated merocyanine dye, 300 angstroms of vapor-coated poly(vinyl butyral) (Butvar ® B-76), and the graded aluminum of Example 1 of U.S. Pat. No. 4,430,366 (to a transmission optical density of 3.5) was prepared. This was exposed by He/Ne laser at an intensity of 5 millijoules/cm$^2$ to form a half-tone image by ablation of the aluminum layer. The construction with the ablated image was developed according to Example 12 and provided a negative image on the receptor sheet.

What is claimed:

1. A process for providing a color image from an imageable article comprising a substrate, a vapor-deposited dye or pigment, and a radiation sensitive layer said process comprising:
   (a) exposing said radiation sensitive layer to an imagewise distribution of radiation which alters the solubility and/or permeability of said layer, and
   (b) heating said imageable article uniformly to evaporate said dye or pigment at different rates from the article to provide an image wherein a receptor is in contact with said article and evaporated dye or pigment deposits on a surface of said receptor to form an image, and
wherein said photoresist layer is an organic negative-acting photoresist layer and said heating is performed without etching of the photoresist layer.

2. A process for providing a color image from an imageable article comprising a substrate, a vapor-deposited dye or pigment, and a radiation sensitive layer said process comprising:
   (a) exposing said radiation sensitive layer to an imagewise distribution of radiation which alters the solubility and/or permeability of said layer, and
   (b) heating said imageable article uniformly to evaporate said dye or pigment at different rates from the article to provide an image wherein a receptor is in contact with said article and evaporated dye or pigment deposits on a surface of said receptor to form an image, and
wherein said photoresist layer is an organic positive-acting photoresist layer and said heating is performed without etching of the photoresist layer.

3. The process of claim 1 wherein said substrate is a polymeric film having a vapor-deposited metal layer on the surface carrying the vapor-deposited dye or pigment.

4. The process of claim 2 wherein said substrate is a polymeric film having a vapor-deposited metal layer on the surface carrying the vapor-deposited dye or pigment.

5. The process of claim 1 wherein said substrate is a polymeric film having a microstructured, radiation-absorbing metal coating on the surface carrying the vapor-deposited dye or pigment.

6. The process of claim 2 wherein said substrate is a polymeric film having a microstructured, radiation-absorbing metal coating on the surface carrying the vapor-deposited dye or pigment.

7. A process for providing a color image from an imageable article comprising a substrate, a vapor-deposited dye or pigment, and a radiation sensitive layer said process comprising:
 (a) exposing said radiation sensitive layer to an imagewise distribution of radiation which alters the solubility and/or permeability of said layer, and
 (b) heating said imageable article uniformly to evaporate said dye or pigment at different rates from the article to provide an image,
wherein a receptor is in contact with said article and evaporated dye or pigment deposits on a surface of said receptor to form an image, said photoresist layer is an organic positive-acting photoresist layer and said heating is performed after etching of the exposed photoresist layer and said substrate is a polymeric film having a vapor-deposited metal layer on the surface carrying the vapor-deposited dye or pigment.

8. A process for providing a color image from an imageable article comprising a substrate, a vapor-deposited dye or pigment, and a radiation sensitive layer said process comprising:
 (a) exposing said radiation sensitive layer to an imagewise distribution of radiation which alters the solubility and/or permeability of said layer, and
 (b) heating said imageable article uniformly to evaporate said dye or pigment at different rates from the article to provide an image,
wherein said substrate is a polymeric film having a microstructured, radiation-absorbing metal coating on the surface carrying the vapor-deposited dye or pigment, and
wherein a receptor is in contact with said article and evaporated dye or pigment deposits on a surface of said receptor to form an image, and
wherein said photoresist layer is an organic positive-acting photoresist layer and said heating is performed after etching of the exposed photoresist layer.

9. A process for providing a color image from an imageable article comprising a substrate, a vapor-deposited dye or pigment, and a radiation sensitive layer said process comprising:
 (a) exposing said radiation sensitive layer to an imagewise distribution of radiation which alters the solubility and/or permeability of said layer, and
 (b) heating said imageable article uniformly to evaporate said dye or pigment at different rates from the article to provide an image,
wherein a vapor-deposited metal layer is between said vapor-deposited dye or pigment and said photoresist layer and said metal layer is also etched before said heating, and
wherein a receptor is in contact with said article and evaporated dye or pigment deposits on a surface of said receptor to form an image, and
wherein said photoresist layer is an organic negative-acting photoresist layer and said heating is performed after etching of the exposed photoresist layer.

10. A process for providing a color image from an imageable article comprising a substrate, a vapor-deposited dye or pigment, and a radiation sensitive layer said process comprising:
 (a) exposing said radiation sensitive layer to an imagewise distribution of radiation which alters the solubility and/or permeability of said layer, and
 (b) heating said imageable article uniformly to evaporate said dye or pigment at different rates from the article to provide an image,
wherein a vapor-deposited metal layer is between said vapor-deposited dye or pigment and said photoresist layer and said metal layer is also etched before said heating, and
wherein said photoresist layer is an organic positive-acting photoresist layer and said heating is performed after etching of the exposed photoresist layer, and
wherein a receptor is in contact with said article and evaporated dye or pigment deposits on a surface of said receptor to form an image.

11. A process for providing a color image from an imageable article comprising a substrate, a vapor-deposited dye or pigment, and a radiation sensitive layer said process comprising:
 (a) exposing said radiation sensitive layer to an imagewise distribution of radiation which alters the solubility and/or permeability of said layer, and
 (b) heating said imageable article uniformly to evaporate said dye or pigment at different rates from the article to provide an image,
wherein said radiation sensitive layer is an inorganic layer which ablates, redissolves or retracts when exposed to radiation to form open areas in the inorganic layer through which the evaporated dye or pigment will pass, and
wherein a receptor is in contact with said article and evaporated dye or pigment deposits on a surface of said receptor to form an image.

* * * * *